United States Patent [19]

Ito

[11] 4,110,640

[45] Aug. 29, 1978

[54] STANDARD SIGNAL GENERATING APPARATUS

[75] Inventor: Kazuo Ito, Komae, Japan

[73] Assignee: Kabushiki Kaisha Daini Seikosha, Japan

[21] Appl. No.: 679,937

[22] Filed: Apr. 26, 1976

[30] Foreign Application Priority Data

Apr. 28, 1975 [JP] Japan .................................. 50-51935

[51] Int. Cl.² ...................... H03K 17/00; G04C 3/00; B23K 9/00
[52] U.S. Cl. .................................. 307/303; 58/23 R; 219/121 LM; 331/109
[58] Field of Search .......................... 58/23 V, 23 AC; 331/109 M, 110; 307/303; 219/121 LM; 357/84

[56] References Cited

U.S. PATENT DOCUMENTS

| | | | |
|---|---|---|---|
| 2,903,630 | 9/1959 | Cohen et al. | 357/84 |
| 3,683,213 | 8/1972 | Staudte | 58/23 IF |
| 3,727,151 | 4/1973 | Koehler | 58/23 IF |
| 3,766,616 | 10/1973 | Staudte | 310/312 |
| 3,768,157 | 10/1973 | Buio | 219/121 M |
| 3,805,509 | 4/1974 | Assmus et al. | 58/23 V |
| 3,889,459 | 6/1975 | Lu | 58/23 AC |
| 3,945,194 | 3/1976 | Gollinger | 58/23 R |
| 3,975,898 | 8/1976 | Nishimura | 58/23 P |

Primary Examiner—Stanley D. Miller, Jr.
Assistant Examiner—B. P. Davis
Attorney, Agent, or Firm—Robert E. Burns; Emmanuel J. Lobato; Bruce L. Adams

[57] ABSTRACT

The combination of a transparent substrate, and a plurality of standard signal generating circuits, for developing respective oscillatory output signals at a standard frequency. The plurality of signal generating circuits are disposed on a major surface of the substrate, and each includes at least one unbroken adjusting lead, which can be broken by irradiation with laser light, to set the frequency of the oscillatory output signal.

3 Claims, 9 Drawing Figures

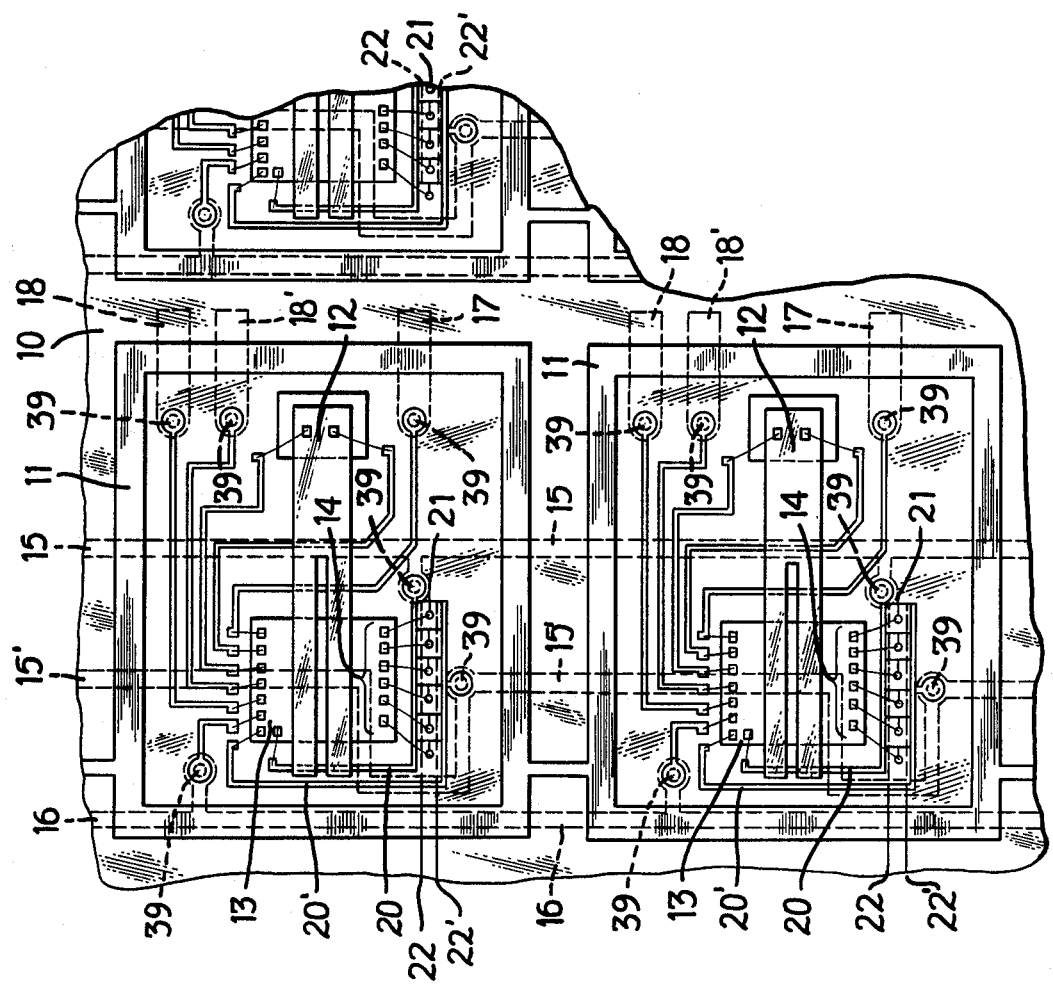
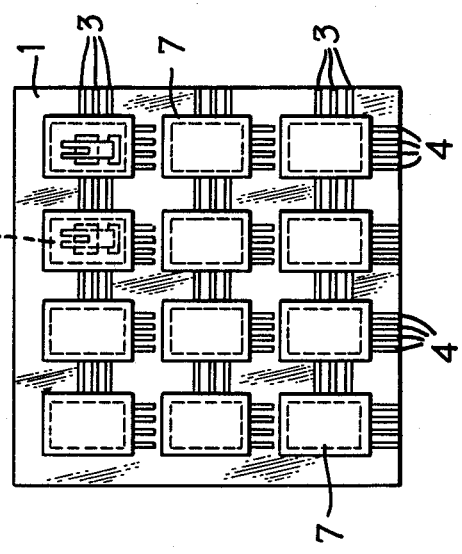

STANDARD SIGNAL GENERATING APPARATUS

BACKGROUND

This invention relates to a manufacturing method to obtain the structure of a standard signal generating apparatus including a plurality of signal generators comprising an oscillator having a non-adjusting thin plate vibrator fabricated with etching and a variable dividing circuit, and to fabricate a plurality of the signal generators at the same time, and more particularly to the standard signal generating apparatus for a time standard of the watch fabricated by the method according to the present invention.

Conventionally, as shown in FIG. 1 a watch type of standard signal generating apparatus is arranged with many signal generating units on one transparent substrate 1 and the common connecting leads 3 of each of the signal generating units and the elongated leads 4 of each of the signal generating units serves as the distributed lead electrodes on the surface of the substrate.

Further, FIG. 2 shows a sectional view of the signal generating unit and shows the thin plate quartz crystal vibrator 5, the oscillator making the quartz crystal vibrator oscillate and the integrated circuit element 6 having another function.

The vibrator 5 and integrated circuit element 6 are encapsulated to maintain a vacuum and inert gas-atmospher with the cover 7 made of a ceramic material or the like and the cover 7 is encapsulated to maintain airtightness with adhesive 8. In such conventional structure, both of the cover and the adhesive must be insulating material because the cover is subject to the condition that the respective connecting leads are electrically insulating each other.

Accordingly, the defects are as follows;

(1) In the sectional view of the cover portion including the connecting lead and the elongated lead (pattern of electrodes) illustrating the transparent substrate 1, the connecting lead 3 or the elongated lead 4, the low melting point glass 8 and the cover 7 of the ceramic material, the boundary of the respective layers is insufficiently airtight and reliable. Especially, the boundary of the conductive material is insufficient to maintain airtightness and reliability.

(2) The cover of the ceramic material needs to have considerable thickness in order to secure the airtightness so that the miniaturization of the cover is difficult.

(3) There are the high molecular weight materials such as the plastic and the epoxy resins. However, these insulating materials can not secure the vacuum.

(4) The processing temperature at which the cover is fixed and is sealed to the substrate with low melting point glass is 500° C. This temperature destroys the operating function of the vibrator and the integrated circuit element so that the productivity of the signal generating unit is low.

(5) The cover which has the predetermined height with the calcined manufacture of the ceramic material is high in cost.

BRIEF DESCRIPTION OF THE DRAWINGS

FIG. 1 is a plan view illustrating the manufacturing process of the conventional standard signal generating apparatus;

FIG. 2 is a sectional view of the conventional standard signal generating apparatus;

FIG. 3 is a plan view illustrating the manufacturing process of the present invention;

DESCRIPTION OF THE PREFERRED EMBODIMENT

Figure 4:
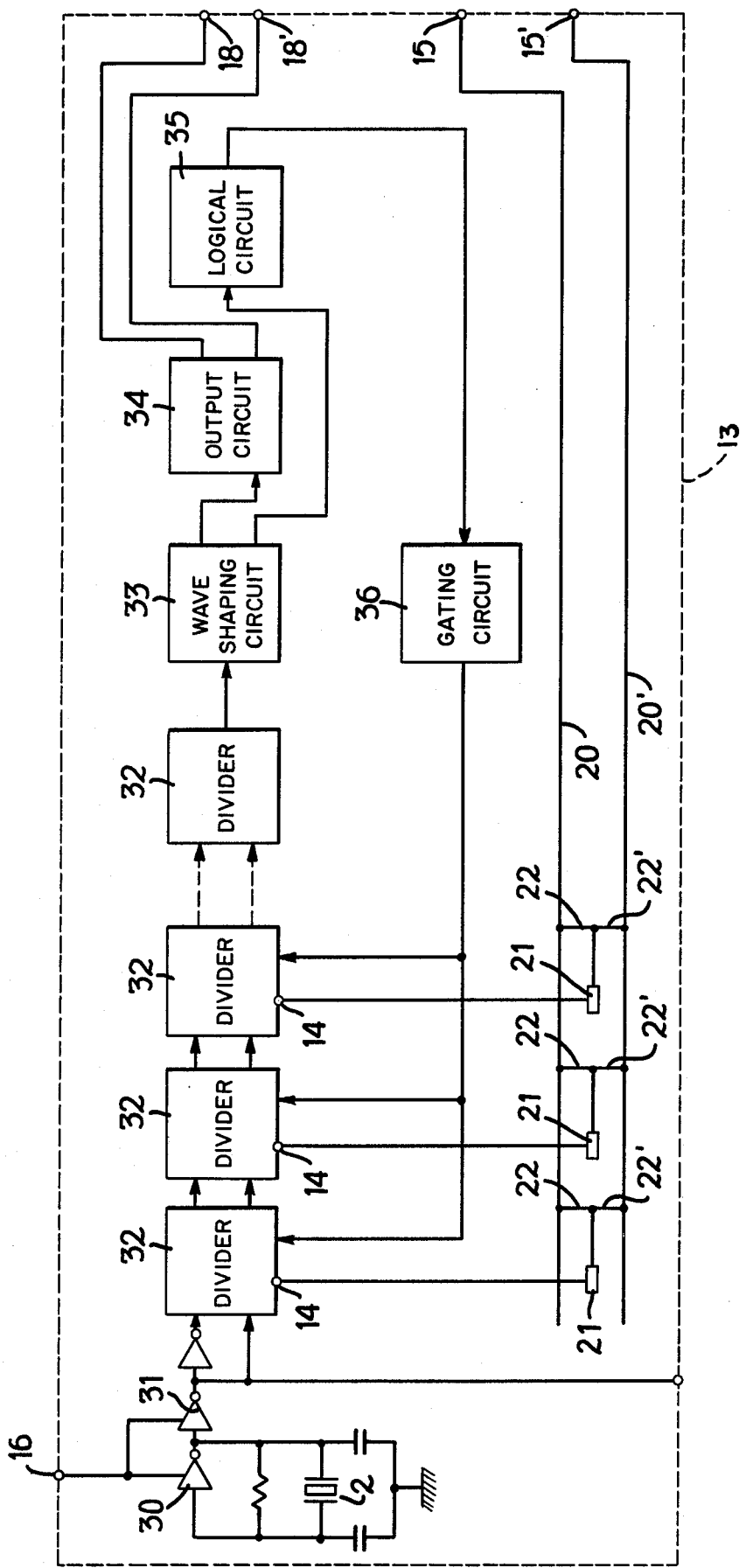
FIG. 4 is a circuit block diagram of the standard signal generating apparatus of the present invention.

FIG. 3 is a plan view showing the manufacturing process for the standard signal generating apparatus and a stage at which the vibrator cover is not fixed to the substrate. A partial view of the transparent substrate 10, which is a material made of a borosilicate glass such as cover glass (form a glass adapted to the junction with metal), is shown in FIG. 3.

The reference numeral 11 depicts a frame which has a rectangular (but may have some other) configuration on the one surface of the transparent board. The frame 11 is metalized by the conductive metallic film, and the respective frames are connected in common with one another.

There is the signal generating unit in the frame. The signal generating unit consists of the tunning fork type quartz crystal vibrator, the osciallator maintaining vibration of said quartz crystal vibrator and the integrated circuit 13 of which the variable divider is comprised.

The integrated circuit 13 illustrated in FIG. 4 includes the circuit 30 serving to vibrate the vibrator, the divider stages 32 comprising a multiple stage divider circuit wherein the divider stages are binary counters, the wave shaping circuit 33 forming the dividing circuit output signal to a predetermined pulse width, and the output circuit 34. The logical circuit 35 counts the frequency signal 00 developed by wave shaping circuit 33 and the gating circuit 36 controls the dividing ratio of the divider circuit so as to develops a predetermined unit time signal. Accordingly, it needs means to control the resetting condition for each unit time to obtain the dividing ratio suitable for the vibrator.

For this purpose, there are the adjusting terminal pads 14 having a number corresponding to the number a dividing stages 32. The adjusting terminal pads 14 are bonded to the adjusting terminal pads 21 connected to the power source leads 20, 20' commonly by connecting leads 22, 22'. And the connecting leads 22 and 22' making the connection between the power source leads 20 and the adjusting terminal pads 21 and the power source 20' are as fine as possible, and as process of the fabrication permits. And either the connecting lead 22 or the connecting lead 22' is cut whereby either the positive or negative voltage is provided to a respective adjusting terminal pad 21 so as to vary the dividing ratio of the divider 32.

The power source leads 20 and 20' disposed on the divider circuit side of the substrate are connected to the common electrodes 15 and 15' formed on the other surface (the opposite surface) of the transparent substrate 10, and are connected to the oscillating power source terminal 16, commonly. Also, the individual electrodes 17, 18 and 18' are formed on the other surface.

These electrodes 17, 18 and 18' are connected electrically to the electrode pattern on the surface of the substrate with the means which is later described.

Herein, the reference numeral 17 depicts the frequency measuring terminal and the reference numerals 18 and 18' are the output terminals.

The member to connect one surface of the transparent substrate electrically with the other surface is the pin 39 embedded on the transparent substrate 10. Namely, holes are made in the transparent substrate by photo-etching using photo-technology employing a sheet such as cover glass or the like, or with an ultrasonic machining device.

Figure 6A:
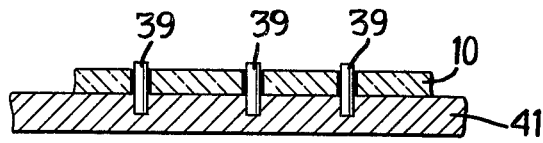
FIG. 6(a), (b) and (c) are descriptive views of the substrate in the present invention.
Figure 6B:
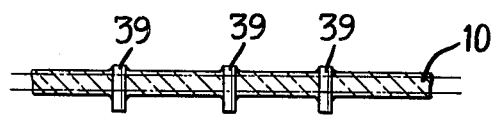

The pins, respectively are inserted in these holes of the transparent substrate and the transparent substrate having the pins is disposed on the jig plate 41 (Refer to FIG. 6A) and then the transparent substrate is deposited in a furnace so that the pins are fixed to the transparent substrate. And thereafter, the portion of the substrate above and below the two dotted lines in FIG. 6B is removed with lapping.

Figure 6C:

The transparent substrate 10 shown in FIG. 6C is finished with polishing. The pin 39 which is made of a conductive metallic material may be of a material which has thermal properties equivalent to those of the transparent substrate material. The joint will be reliable at the interface between the metal and the glass.

The surface finishing with lapping and polishing is compatible with the fabricating technology of the thin film electrode when the electrode pattern on the substrate surfaces and the frame 11 is metallized.

Figure 5:
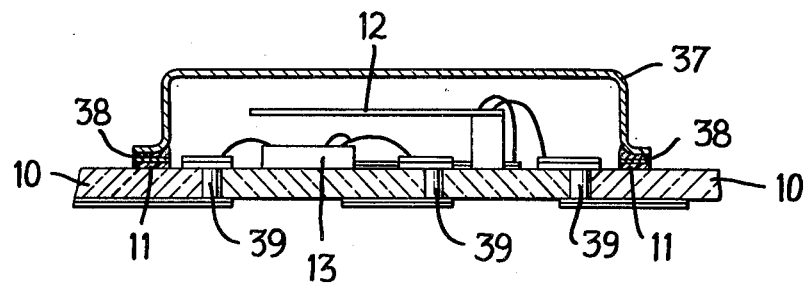
FIG. 5 is a sectional view of the standard signal generating circuit of the present invention.

FIG. 5 shows a sectional view of the standard signal generating apparatus of the present invention. The vibrator 12 and integrated circuit 13 are hermetically sealed with the cover 37 made of a metal. Namely, the metallic cover 37 is joined to the metalized frame of metallic film formed on the transparent substrate 10 by a brazing material such as solder.

The elongated terminals which serves as terminals for the respective signal generating units arrive at the opposite surface of the transparent substrate through the pins 39.

In the above described structure, the frequency adjustment of a plurality of signal generating units is made after the units have been mounted or formed on the transparent substrate. This frequency adjustment is made by cutting either the connecting lead 22 or 22' on the surface of the transparent substrate 10 by operating the laser-oscillator 51 according to predetermined input data.

Figure 7:
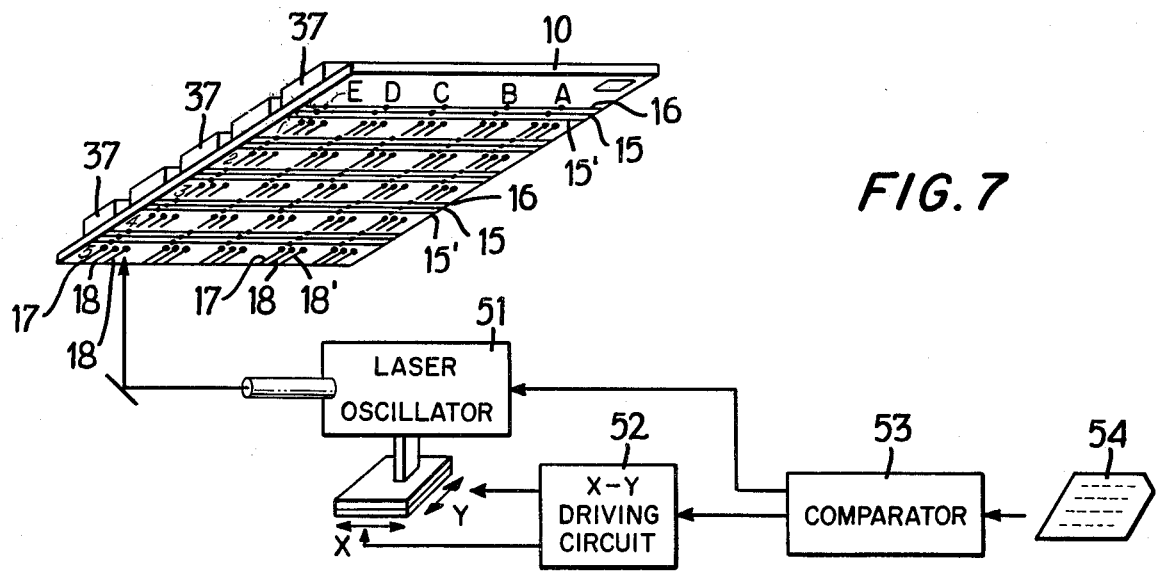
FIG. 7 is a descriptive view of the process for setting the frequency of the standard signal generating circuit of the present invention.

FIG. 7 shows the embodiment of structure for making the above described frequency adjustment. The reference numeral 51 depicts the laser-oscillator and the reference numeral 52 depicts an X-Y driving circuit to determine the relative position between the laser-spot and the substrate. The reference numeral 53 depicts a comparator and the reference numeral 54 depicts input data.

A mechanical vibrator such as the quartz crystal vibrator needs a aging process during which it is maintained vibrating for a relatively long duration, before the frequency adjustment, in order to eliminate any initial frequency change.

In accordance with this invention, the input data is the operating frequency value which is read from the respective frequency measuring terminals with consideration of the practical condition like the temperature taken into account.

In the construction of this invention, the adjacent and oscillating functional units produce a beat phenomenon derived from resonance. Therefore, since it is otherwise impossible to obtain the reading accuracy of the frequency, resonance is prevented with shielding attained by connecting the frames 11 to earth for placing each metallic cover 37 at the earth potential commonly.

As it is apparent from the above mentioned description, the cover which is made of the metallic material may fabricated at low cost and easily, and which is possible to hermetically seal at about 250° C. so that the components housed there in are not damaged. It is possible to fabricate small, since the thickness dimension of the thin substrate and flange portion for the terminal does not have to be substantial.

Also, the structure using the photo-technology which determines the position of the embedded pin has high accuracy and it is possible to fabricate automatically 20-30 signal generating units simultaneously on the transparent substrate of 50mm length, 60mm width and 0.4mm thickness and the standard signal can be adjusted with an automatic process.

In accordance with this invention, especially, the mechanical vibrator as the signal source is suitable to be a flexural vibrator fabricated with etching a thin piezoelectric body.

Namely, the configuration of the photo-technology and the determination of the frequency range is attained in accordance with this invention.

The integrated circuit element of which the number of the adjusting pads is few, is small.

As mentioned the above, the small sized and low cost standard signal generating apparatus is practical for use as the time reference source of the wrist watch.

I claim:

1. In combination: a transparent substrate having a pair of opposed major surfaces; and a plurality of standard signal generating circuits each comprising a mechanical vibrator disposed on one of said major surfaces, an oscillator circuit for driving said mechanical vibrator to vibrate and for developing an oscillatory output signal determined by said mechanical vibrator, a metallic thin film disposed on said one major surface and defining thereon a frame of metallic thin film surrounding said mechanical vibrator and said oscillator circuit, a metallic, cover disposed on said major surface and covering said mechanical vibrator and said oscillator circuit and joined to said frame to peripherally seal said cover to said substrate, a divider circuit disposed within said cover and connected to receive the oscillatory output signal of said oscillator for developing a lower frequency oscillatory standard frequency signal having a standard frequency determined by the oscillator frequency and a dividing ratio of said dividing circuit, and said dividing circuit having at least one adjusting lead for receiving a power signal for setting the dividing ratio of said divider circuit according to whether said at least one adjusting lead is connected to a positive potential lead or a negative potential lead of the power signal and thereby setting the value of said standard frequency, said positive potential lead and said negative potential lead comprising polished conductive pins extending through said transparent substrate, and said at least one adjusting lead being connected to said positive potential lead and said negative potential lead and being disposed on one of the major surfaces of said substrate to permit breaking of the connection of said at least one adjusting lead with a respective one of said positive and negative potential leads by irradiating the same with laser light in order to set the value of said standard frequency.

2. In the combination according to claim 1, wherein said dividing circuit comprises a plurality of divider stages connected in cascade, and wherein respective ones of said divider stages have corresponding adjusting leads for setting said standard frequency value.

3. In the combination according to claim 1, further comprising means for electrically connecting the respective metallic cover of each of said standard signal generating circuits for maintaining the respective metallic covers at a same electrical potential.

* * * * *